US008897467B2

(12) United States Patent
Murin et al.

(10) Patent No.: US 8,897,467 B2
(45) Date of Patent: Nov. 25, 2014

(54) CAPACITIVE LOAD DRIVING AMPLIFIER

(75) Inventors: Peter Murin, Poltar (SK); Tomas Folk, Pisek (CZ); Pavel Panus, Praha (CZ)

(73) Assignee: STMicroelectronics Design and Application S.R.O., Prague (CZ)

( * ) Notice: Subject to any disclaimer, the term of this patent is extended or adjusted under 35 U.S.C. 154(b) by 709 days.

(21) Appl. No.: 12/976,624

(22) Filed: Dec. 22, 2010

(65) Prior Publication Data

US 2011/0150245 A1     Jun. 23, 2011

(30) Foreign Application Priority Data

Dec. 23, 2009   (EP) .................................... 09180680

(51) Int. Cl.
  *H03F 99/00*   (2009.01)
  *H03F 3/45*    (2006.01)

(52) U.S. Cl.
  CPC ........ *H03F 3/45183* (2013.01); *H03F 3/45475* (2013.01)
  USPC ......................................... 381/120; 330/253

(58) Field of Classification Search
  CPC ................. H03F 3/45475; H03F 2203/45528; H03F 2203/45138; H03F 3/45; H03F 3/45179; H03F 3/45183
  USPC ............ 381/120, 121, 111, 28; 330/253, 252, 330/258, 69
  See application file for complete search history.

(56) References Cited

U.S. PATENT DOCUMENTS

| | | | | | |
|---|---|---|---|---|---|
| 3,516,006 | A | * | 6/1970 | Donjon | 330/69 |
| 3,551,839 | A | * | 12/1970 | Barker | 330/99 |
| 4,012,704 | A | * | 3/1977 | Rollett | 333/28 R |
| 4,047,122 | A | * | 9/1977 | Rao | 330/84 |
| 4,064,761 | A | * | 12/1977 | Giers et al. | 73/462 |
| 4,241,428 | A | * | 12/1980 | Berni et al. | 367/21 |
| 4,242,741 | A | * | 12/1980 | Parrish | 367/21 |
| 5,568,561 | A | * | 10/1996 | Whitlock | 381/120 |
| 5,594,168 | A | * | 1/1997 | Terajima | 73/496 |
| 5,614,864 | A | * | 3/1997 | Stubbe et al. | 330/69 |
| 5,705,954 | A | * | 1/1998 | Ishiyama | 330/303 |
| 5,990,737 | A | * | 11/1999 | Czarnul et al. | 330/69 |
| 6,147,549 | A | * | 11/2000 | Ohno | 327/541 |
| 6,515,542 | B1 | * | 2/2003 | Wang et al. | 330/69 |
| 6,690,225 | B2 | * | 2/2004 | Kondo et al. | 327/307 |
| 6,867,649 | B2 | * | 3/2005 | Lehto | 330/252 |

(Continued)

FOREIGN PATENT DOCUMENTS

| | | | | |
|---|---|---|---|---|
| EP | 1548933 | 6/2005 | | H03F 1/02 |
| WO | WO 01/35526 | 5/2001 | | H03F 1/34 |

*Primary Examiner* — Vivian Chin
*Assistant Examiner* — Leonard M Giannone
(74) *Attorney, Agent, or Firm* — Allen, Dyer, Doppelt, Milbrath & Gilchrist, P.A.

(57) ABSTRACT

An electronic amplifier for driving a capacitive load may include first and second differential input terminals to receive an input signal, and first and second differential output terminals to provide a differential output signal. The amplifier may further include a first operational device having first and second differential inputs connected to the first and second differential input terminals, respectively, and an output connected to the first differential output terminal, and a second operational device having first and second differential inputs connected to the first and second differential input terminals, respectively, and an output connected to the second differential output terminal. The first and second operational devices may be operatively configured so that both the first and the second output terminals are at a same reference potential during periods in which a magnitude of differential output signal amplitude decreases.

23 Claims, 3 Drawing Sheets

(56) References Cited

U.S. PATENT DOCUMENTS

| | | |
|---|---|---|
| 7,068,095 B2 * | 6/2006 | Bernardon ................. 330/9 |
| 7,078,941 B2 * | 7/2006 | Tsuchi ..................... 327/108 |
| 7,098,735 B2 * | 8/2006 | Ranganathan ............. 330/252 |
| 7,176,910 B2 * | 2/2007 | Tsuchi ..................... 345/204 |
| 7,233,772 B1 * | 6/2007 | Darabi et al. ............. 455/20 |
| 7,288,990 B2 * | 10/2007 | Ranganathan ............. 330/252 |
| 7,560,959 B2 * | 7/2009 | Paraschou et al. ......... 327/72 |
| 8,248,164 B2 * | 8/2012 | Jordan et al. ............. 330/301 |
| 2003/0052738 A1 * | 3/2003 | Tanaka et al. ............. 330/258 |
| 2004/0160269 A1 * | 8/2004 | Tsuchi ..................... 327/561 |
| 2005/0012549 A1 * | 1/2005 | Takeda ..................... 330/140 |
| 2005/0013029 A1 * | 1/2005 | Brenden ................... 360/46 |
| 2005/0206412 A1 * | 9/2005 | Moraveji ................... 327/54 |
| 2005/0231277 A1 * | 10/2005 | Ogawa ..................... 330/98 |
| 2006/0261884 A1 * | 11/2006 | Gammie et al. ........... 330/9 |
| 2007/0069811 A1 * | 3/2007 | Schley-May et al. ...... 330/75 |
| 2007/0139350 A1 * | 6/2007 | Kawaguchi et al. ....... 345/100 |
| 2007/0188223 A1 * | 8/2007 | Nishimori ................. 330/51 |
| 2007/0241817 A1 * | 10/2007 | Yokota ..................... 330/255 |
| 2009/0261904 A1 * | 10/2009 | Chang ...................... 330/257 |
| 2011/0140945 A1 * | 6/2011 | Sundblad .................. 341/155 |
| 2012/0056671 A1 * | 3/2012 | Jordan et al. ............. 330/252 |

* cited by examiner

CAPACITIVE LOAD DRIVING AMPLIFIER

FIELD OF THE INVENTION

The present invention relates to electronic amplifying devices, and in particular, to a capacitive load driving amplifier.

BACKGROUND OF THE INVENTION

In recent electronic amplifiers devised to drive a capacitive load, for example, in audio amplifiers usable in battery-operated portable devices, there may be a need to have reduced current consumption. A known electronic amplifier usable to drive a capacitive load generally comprises a differential amplifier, which includes differential input terminals to receive an input signal Vin, for example, a substantially sinusoidal voltage signal. In addition, the differential amplifier operates to amplify the input signal Vin in order to provide first V1 and second V2 output voltages to respective differential output terminals of the amplifier. The first V1 and second V2 output voltages have opposite polarity in respect to a common mode voltage VCM.

The differential amplifier is powered from a power supply potential VDD and a ground GND potential, the common mode voltage VCM is in the middle between the power supply VDD and ground GND in order to reach maximum swing of a differential output signal Vout=V1−V2. The differential amplifier described comprises an output stage which drives the capacitive load. Particularly, the output stage is so configured that energy from the power supply potential VDD is consumed both during charging periods of the capacitive load and during discharging periods as well. In fact, conduction of output transistors forming the output stages of the differential amplifier is handled during the mentioned charging/discharging periods so that to define with the capacitive load itself a conduction path for the current flowing from the power supply potential VDD and the ground potential GND both in the charging periods and in the discharging periods. Therefore, when the differential amplifiers are used in portable device, a large amount of current consumption may reduce the life of the power supply batteries, thereby compromising the portability of the device itself.

SUMMARY OF THE INVENTION

An object is to provide an electronic amplifier for driving a capacitive load that may overcome the drawbacks and limits of the known amplifiers, particularly with reference to current consumption.

This object is achieved by an electronic amplifier for driving a capacitive load. The electronic amplifier may include first and a second differential input terminals configured to receive an input signal, first and second differential output terminals configured to provide a differential output signal to the capacitive load, and a first operational device having first and second differential inputs connected to the first and second differential input terminals, respectively, and an output connected to the first differential output terminal. The electronic amplifier may include a second operational device having first and second differential inputs connected to the first and second input terminals, respectively, and an output connected to the second differential output terminal. The first and second ended operational devices may be configured to provide the first and second differential output terminals at a reference voltage during periods where an amplitude of the differential output signal decreases.

BRIEF DESCRIPTION OF THE DRAWINGS

The characteristics and the advantages of the present electronic amplifier may be better understood from the following detailed description of one embodiment thereof, which is given by way of illustrative and non-limiting example with reference to the annexed drawings, in which.

DETAILED DESCRIPTION OF THE PREFERRED EMBODIMENTS

Figure 1:
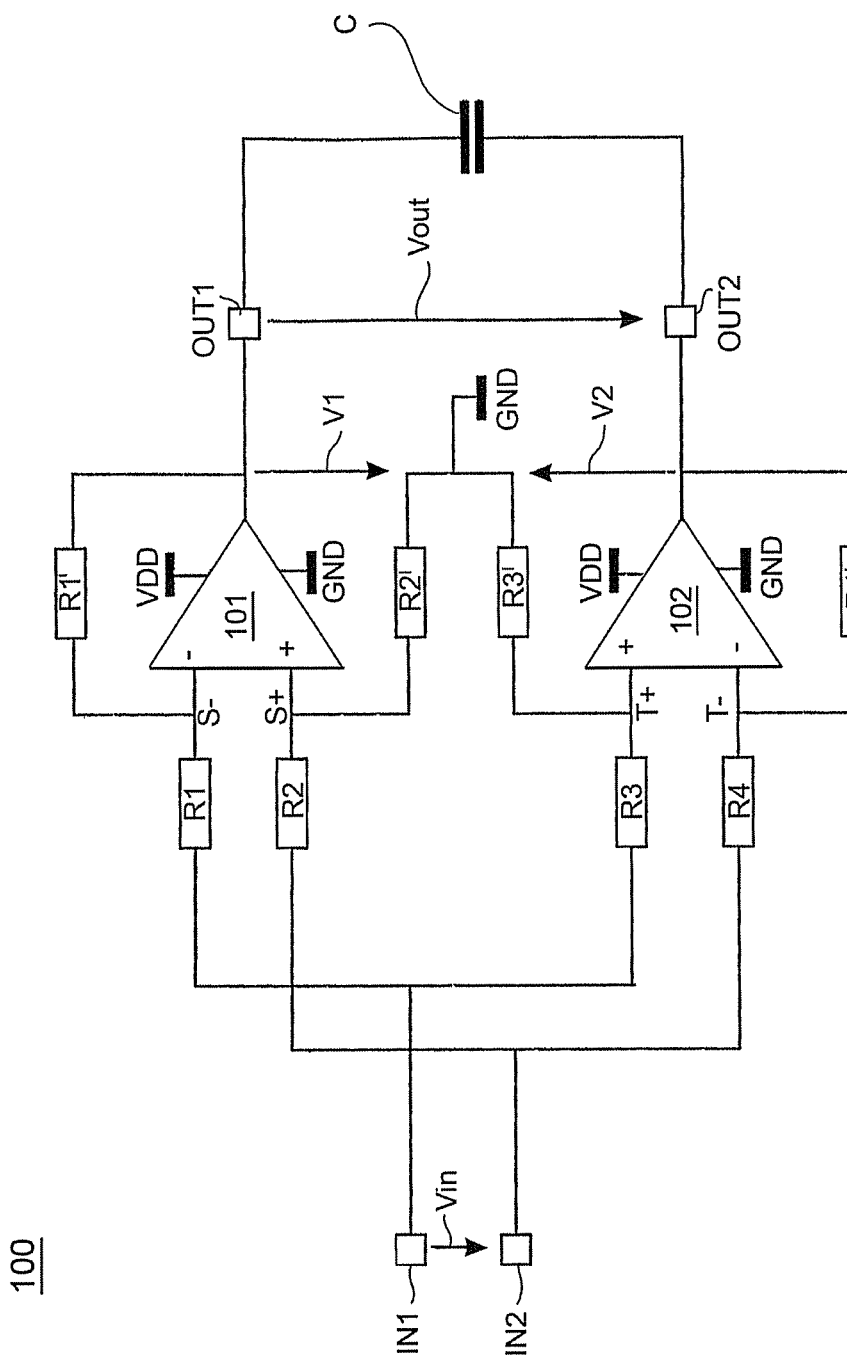
FIG. 1 shows a circuit block diagram of an electronic amplifier in accordance with the present invention.

A circuit block diagram of a preferred embodiment of an electronic amplifier 100 of the invention can be described with reference to FIG. 1. It may be noted that this electronic amplifier 100 can be integrated on a chip of semiconductor material or can be formed of discrete components. In addition, the electronic amplifier 100 can be preferably used for driving a capacitive load C the as, for example, a piezoelectric actuator. The electronic amplifier 100 is suitable to drive as well piezoelectric loudspeakers, for example in portable devices, fire alarms, etc.

The electronic amplifier 100 can be used both for amplifying alternating current (AC) signals with or without a direct current (DC) offset. The amplifier 100 is capable to amplify both sinusoidal signals, i.e. comprising only one harmonic, or signals including a plurality of harmonics. The electronic amplifier 100 comprises a differential input port including first IN1 and second IN2 input terminals to receive an input differential signal Vin, for example, a substantially sinusoidal signal of the audio type having peak-to-peak amplitude equal to $2V_{in}$. Moreover, the amplifier 100 also comprises a differential output port including first OUT1 and second OUT2 output terminals so that the capacitive load C to be driven is connected between the output terminals.

In more detail, the electronic amplifier 100 comprises first 101 and second 102 operational devices or power amplifiers each provided with differential inputs. Particularly, the first operational device 101 comprises a first S− differential input connected to the first input terminal IN1 through a first resistor R1 and a second S+ differential input connected to the second input terminal IN2 through a second resistor R2.

Analogously, the second operational device 102 comprises a further first T+ differential input connected to the first input terminal IN1 through a third resistor R3 and a further second T− differential input connected to the second input terminal IN2 through a fourth resistor R4. It should be observed that the electronic amplifier 100 is arranged so that resistors R1, R2, R3, R4 might be equal to one another, but generally the resistors are different.

In addition, both the first 101 and the second 102 operational devices comprise a respective power supply terminal connected to a power supply potential VDD, provided for example, by a battery, and a reference ground terminal to be connected to a ground potential GND.

A shown in FIG. 1, the first differential input S− of the first operational device 101 is connected to the first output terminal OUT1 through a further first resistor R1', which represents a feedback resistor for the first operational device 101. The second S+ differential input of the first operational device 101 is connected to the ground potential GND through a further second resistor R2'.

Analogously, the further first T+ differential input of the second operational device 102 is connected to the ground potential GND through a further third resistor R3'. The further second differential input T− of the second operational device 102 is connected to the second output terminal OUT2 through a further fourth resistor R4', which represents a feedback resistor for the second operational device 102. The first 101 and the second 102 operational devices of the electronic amplifier 100 are single-ended amplifiers with their outputs corresponding to the first OUT1 and the second OUT2 output terminals, respectively.

It may be observed that the further resistors R1', R2', R3', R4' of the electronic amplifier 100 are arranged so that ratios of each resistance of the resistors R1', R2', R3', R4' with the corresponding resistance of the resistors R1, R2, R3, R4, are equal, i.e. R1'/R1=R2'/R2=R3'/R3=R4'/R4. In addition, further resistors R1', R2', R3', R4' are generally different to one another, but might be equal, i.e. R1'=R2'=R3'=R4'.

The operational devices 101 and 102 operate so that the first operational device 101 can deliver to the first output terminal OUT1 a first amplified signal V1 referred to ground GND starting from the input signal Vin applied to its inputs, S+, S−. Analogously, the second operational device 102 is suitable to deliver to the second output terminal OUT2 a second amplified signal V2 referred to ground GND starting from the input signal Vin applied to its corresponding inputs T+, T−.

Figure 5A:
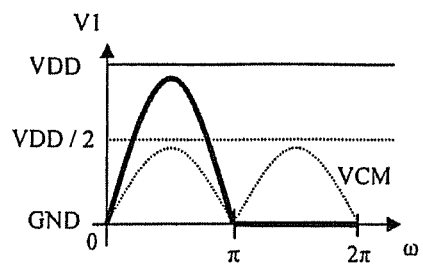
FIGS. 5A-C show schematically, with respect to a pulsation, waveforms of output voltages associated to the electronic amplifier of FIG. 1.
Figure 5B:
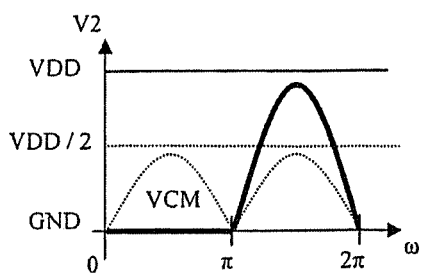

As known by those skilled in the art, both the first 101 and second 102 operational devices provide a signal voltage amplification that can be set by the value of resistors R and R'. FIGS. 5A and 5B show, with respect a pulsation, waveforms of the first V1 and second V2 output voltage amplified signals provided in the first OUT1 and second OUT2 output terminals, respectively.

It should be observed that the electronic amplifier 100 comprises a common mode voltage value VCM that can be calculated as VCM=(V1+V2)/2, where V1 and V2 are output nodes' voltages above mentioned. If no differential input signal is applied in the input ports IN1, IN2, both the first output terminal OUT1 and the second output terminal OUT2 are equal to low output rail GND. If, on the contrary, an input differential signal Vin is applied to the input port IN1, IN2, one of the operational devices keeps its output at low rail GND, while the other operates to amplify the input signal so that its output voltage tends to be in a range between the ground potential GND and the power supply potential VDD, depending on the amplitude of the input signal Vin and voltage gain.

The electronic amplifier 100 provides, at the output terminals OUT1,OUT2, an amplified differential output voltage signal Vout=V1−V2 starting from the differential input signal Vin applied to the input port IN1, IN2, which is in accordance to the following equation: Vout=(−R'/R)Vin; where −R'/R=−R1'/R1=−R2'/R2=−R3'/R3=−R4'/R4 can be applied.

Figure 2:
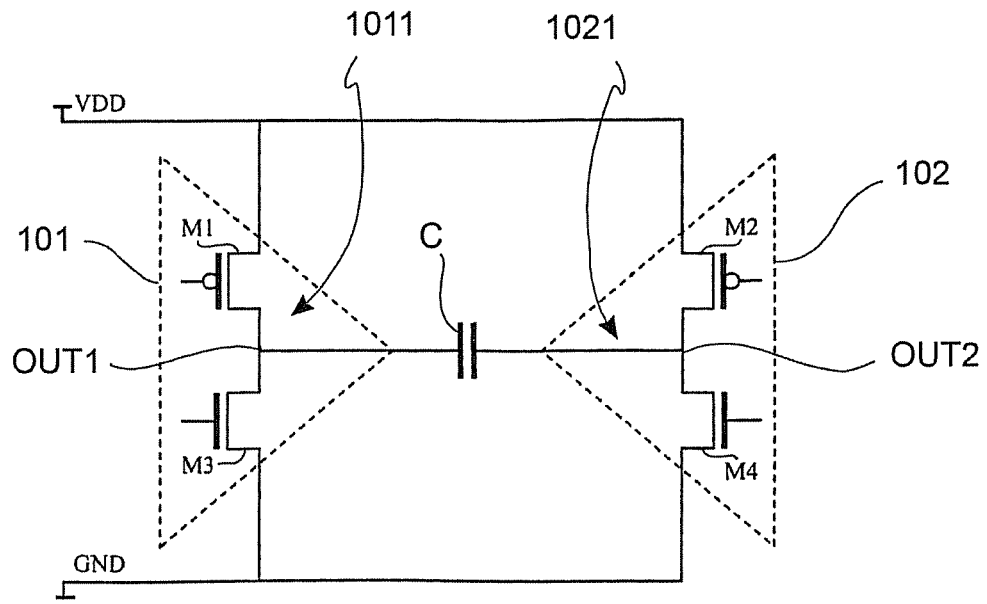
FIG. 2 shows a circuit diagram of an output stage of the electronic amplifier of FIG. 1.
Figure 5C:
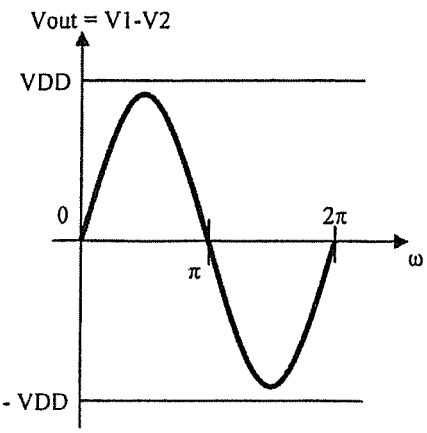

A waveform of the differential output voltage signal Vout is represented in FIG. 5C as a function of pulsation. FIG. 2 illustrates schematically a circuit diagram of an output stage of the electronic amplifier 100. Particularly, the output stage comprises first 1011 and second 1021 output stages of the inverting type, associated to the first 101 and to the second 102 operational devices, respectively. In FIG. 2, the first 101 and second 102 operational devices are schematically indicated by triangles with their outlines in broken lines.

The first 1011 and second 1021 output stages are connected between the power supply potential VDD and the ground potential GND. In more detail, the first output stage 1011 comprises a first M1 (P-MOS) and a second M3 (N-MOS) MOS transistors connected to one another by way of their respective drain terminals. Similarly, the second output stage 1021 comprises a third M2 (P-MOS) and a fourth M4 (N-MOS) MOS transistors connected to one another through their respective drain terminals.

Particularly, it may be noted that the drain terminals of these first M1, second M3, and third M2, fourth M4 transistors correspond to the first OUT1 and second OUT2 output terminals of the electronic amplifier 100, respectively. Therefore, the capacitive load C is connected between the drain terminals.

When one of the previous transistors M1, M2, M3, M4 is "activated", it means that the transistor does contribute to forming of the amplifiers output signal. On the other side, when one of the transistors M1, M2, M3, M4 is "deactivated", it means that the transistor does not contribute to forming of the amplifiers output signal, i.e. it is in quiescent condition.

With reference to FIGS. 3A-D and FIGS. 4A-D, the differential output voltage signal Vout=V1−V2 provided by the amplifier 100 to the capacitive load C and corresponding charging/discharging current signals involved in the first 1011 and second 1021 output stages at a transistor level are analyzed in detail. As an example, it is assumed that the output signal Vout is a sinusoidal signal divided into four quarters of its period from 0 to 2π radians as indicated in FIGS. 4A-D. It may be observed that the differential output voltage Vout has a peak-to-peak amplitude lower than 2VDD.

Moreover, in FIGS. 3A-D currents flowing through transistors M1, M3, M2, M4 and the capacitive load C during each of quarter of period from 0 to 2π radians are drawn. One of the currents, Ibatt, is taken from the power supply potential VDD to charge the capacitive load C. The waveform of current Ibatt is schematically represented in FIGS. 4A-D.

Figure 3A:
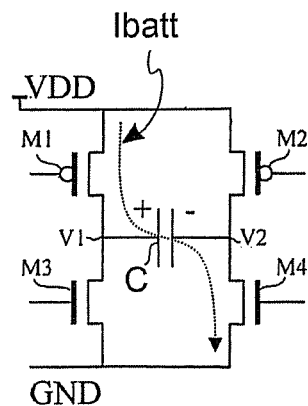
FIGS. 3A-D show the circuit diagram of FIG. 2 schematically indicating an output voltage on a capacitive load and currents involved in successive functioning periods of the electronic amplifier of FIG. 1.
Figure 4A:
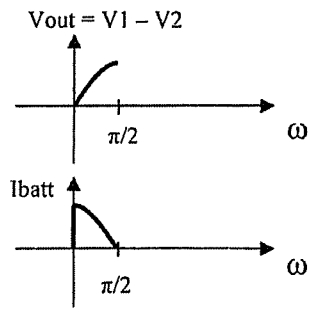
FIGS. 4A-D show, with respect to a pulsation, waveforms of the output voltage on the capacitive load and the current from the power supply related to the periods of FIGS. 3A-D.

With reference to FIGS. 3A and 4A, from 0 to π/2 radians. P-MOS transistor M1 of the first output stage 1011 and N-MOS transistor M4 of the second output stage 1021 are both "activated", while transistors M3 and M2 are both "deactivated". Therefore, the capacitive load C is charged from power supply potential VDD by the current Ibatt. In the quarter of period, the output voltage Vout rises and current Ibatt decreases from its nominal value to zero corresponding to the condition of capacitive load C fully charged.

Figure 3B:
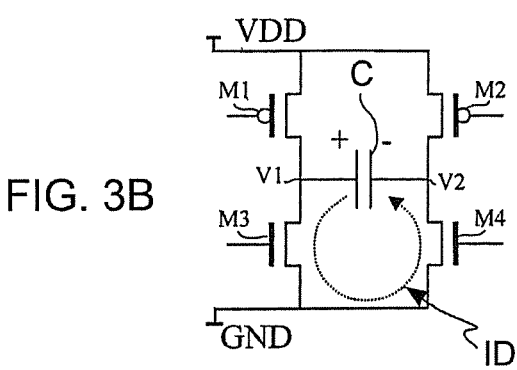
Figure 4B:
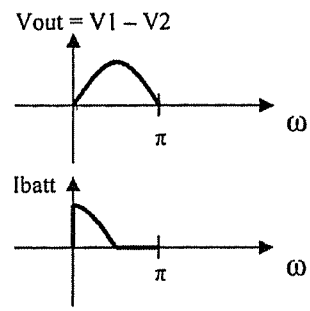

With reference to FIGS. 3B and 4B, from π/2 to π radians, N-MOS transistor M3 of the first output stage 1011 and N-MOS transistor M4 of the second output stage 1021 are both "activated", while transistors M1 and M2 are "deactivated". Therefore, the capacitive load C is short circuited to the ground potential GND so that to be discharged by a discharging current ID. In the quarter of period, the output voltage Vout decreases and current Ibatt is maintained null.

Figure 3C:
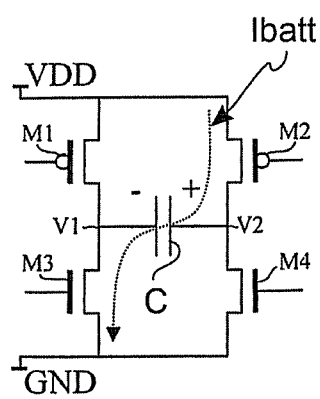
Figure 4C:
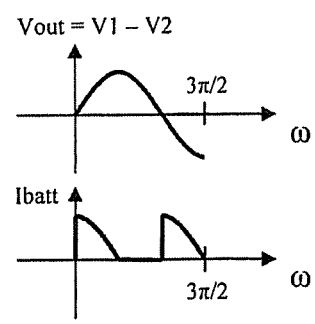

With reference to FIGS. 3C and 4C, from π to 3π/2 radians, P-MOS transistor M2 of the second output stage 1021 and N-MOS transistor M3 of the first output stage 1011 are both "activated", while transistors M1 and M4 are "deactivated".

In this case, the capacitive load C is charged from power supply potential VDD by the current Ibatt. In the quarter of period, the output voltage Vout is inverted and rises, particularly the absolute value of Vout rises, while the current Ibatt decreases from its nominal value to zero corresponding to the condition of capacitive load C fully charged.

Figure 3D:
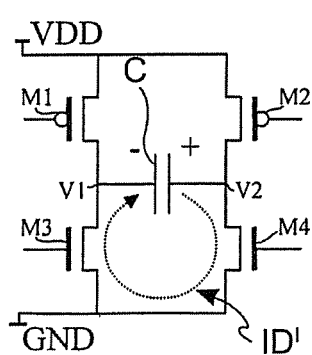
Figure 4D:
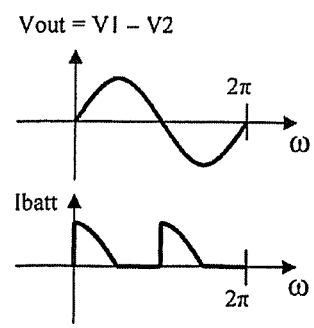

With reference to FIGS. 3D and 4D, from $3\pi/2$ to $2\pi$ radians, N-MOS transistor M3 of the first output stage 1011 and N-MOS transistor M4 of the second output stage 1021 are both "activated" and remaining transistors M1 and M2 are "deactivated". The capacitive load C is short circuited to the ground potential GND so that to be discharged by a further discharging current ID'. In the quarter of period, the absolute value of output voltage Vout decreases and current Ibatt is maintained null.

In other words, during periods in which a magnitude of amplitude of differential output signal Vout decreases, the first 101 and second 102 operational devices of electronic amplifier 100 are configured to sink one node of the capacitive load C to the same reference ground potential GND, by activating a sinking transistor, for example, N-MOS M3 of the first operational device 101, when the load C is being discharged by a corresponding sinking N-MOS transistor M4 of the second operational device 102. In this way, the capacitive load C is discharged at the same time by the two sinking transistors of both operational devices 101, 102, and the power involved in discharge is dissipated by these transistors.

It should be observed that even if only one sequence of driving the capacitive load C by an alternate current signal has been described, the above considerations are also valid for further driving sequences. Advantageously, the proposed electronic amplifier 100 consumes in average only ideally half of the Ibatt current provided by the power supply potential VDD compared to the current consumption in fully-differential amplifiers known in the art.

It may be noted that the current consumption savings associated to the amplifier 100 of this disclosure produce the advantage of reducing the energy dissipation of the amplifier integrated circuitry, and therefore, reducing a overall overheating of the integrated circuitry. That ensures reduced requirements for cooling of the proposed electronic amplifier 100, and the reliability of the same amplifier is increased. It should be observed that the proposed electronic amplifier 100 can be used for driving a capacitive load C with any signal which changes in time, it mans also alternate current signals.

The electronic amplifier 100 of the present disclosure can be used in electronic apparatuses, the as mobile phones, PDAs (Personal Digital Assistant), clocks, alarm clocks, laptops to operate as a driver for a piezoelectric actuator or a piezoelectric speaker embedded in the apparatuses to create vibrations or sounds, respectively. The proposed electronic amplifier 100 can also be used in further electronic apparatuses for creating ultrasound, for example, medical ultrasound equipment and ultrasound air humidifiers.

That which is claimed is:

1. An electronic amplifier for driving a capacitive load having first and second terminals, the electronic amplifier comprising:
   first and second differential input terminals configured to receive an input signal;
   first and second differential output terminals configured to be respectively coupled to the first and second terminals of the capacitive load and to provide a differential output signal to the first and second terminals of the capacitive load;
   a first operational device having first and second differential inputs coupled to said first and second differential input terminals, respectively, and an output coupled to said first differential output terminal; and
   a second operational device having first and second differential inputs coupled to said first and second differential input terminals, respectively, and an output coupled to said second differential output terminal;
   said first and second operational devices being configured to set said first and second differential output terminals and the first and second terminals of the capacitive load at a reference voltage to discharge the first and second terminals of the capacitive load during periods where an amplitude of the differential output signal decreases.

2. The electronic amplifier according to claim 1 wherein said first and second operational devices each comprises an operational amplifier.

3. The electronic amplifier according to claim 1 further comprising first and second resistors configured to couple, respectively, said first and second differential inputs of said first operational device to said first and second differential input terminals.

4. The electronic amplifier according to claim 3 further comprising third and fourth resistors configured to couple, respectively, said first and second differential inputs of said second operational device to said first and second differential input terminals.

5. The electronic amplifier according to claim 4 wherein said first resistor, said second resistor, said third resistor, and said fourth resistor have differing resistance values.

6. The electronic amplifier according to claim 4 wherein said first resistor, said second resistor, said third resistor, and said fourth resistor have equal resistance values.

7. An electronic amplifier for driving a capacitive load having first and second terminals, the electronic amplifier comprising:
   first and second differential input terminals configured to receive an input signal;
   first and second differential output terminals configured to be respectively coupled to the first and second terminals of the capacitive load and to provide a differential output signal to the capacitive load;
   a first single ended operational device having first and second differential inputs and an output coupled to said first differential output terminal;
   first and second resistors configured to couple, respectively, said first and second differential inputs of said first single ended operational device to said first and second differential input terminals;
   a second single ended operational device having first and second differential inputs coupled to said first and second differential input terminals, respectively, and an output coupled to said second differential output terminal;
   third and fourth resistors configured to couple, respectively, said first and second differential inputs of said second single ended operational device to said first and second differential input terminals;
   a fifth resistor configured to couple said first differential output terminal to said first differential input of said first single ended operational device;
   a sixth resistor configured to couple said second differential output terminal to said second differential input of said second single ended operational device;
   a seventh resistor configured to couple said second differential input of said first single ended operational device to a reference voltage; and an eighth resistor configured to couple said first differential input of said second single ended operational device to the reference voltage;

the ratio of a resistance value of said fifth resistor over a resistance value of said first resistor being equal to the ratio of a resistance value of said seventh resistor over a resistance value of said second resistor and also being equal to the ratio of a resistance value of said sixth resistor over a resistance value of the fourth resistor;

said first and second single ended operational devices being configured to set said first and second differential output terminals and the first and second terminals of the capacitive load at a reference voltage to discharge the first and second terminals of the capacitive load during periods where an amplitude of the differential output signal decreases.

8. The electronic amplifier according to claim 7 wherein said first resistor, said second resistor, said third resistor, and said fourth resistor have differing resistance values.

9. The electronic amplifier according to claim 7 wherein said first resistor, said second resistor, said third resistor, and said fourth resistor have equal resistance values.

10. The electronic amplifier according to claim 7 wherein said fifth resistor, said sixth resistor, said seventh resistor, and said eighth resistor have differing resistance values.

11. The electronic amplifier according to claim 7 wherein said fifth resistor, said sixth resistor, said seventh resistor, and said eighth resistor have equal resistance values.

12. The electronic amplifier according to claim 7 wherein said first and second singled ended operational devices are configured to respectively deliver to said first and second differential output terminals first and second amplified signals based upon the input signal the reference voltage.

13. The electronic amplifier according to claim 8 wherein said first and second differential output terminals are configured to provide the differential output signal based upon the equation Vout=(−R'/R)Vin; and wherein where −R'/R=−R1'/R1=−R2'/R2=−R3'/R3=−R4'/R4.

14. The electronic amplifier according to claim 7 wherein said first singled ended operational device includes first and second transistors both coupled to said first differential output terminal via respective conduction terminals; and wherein said second singled ended operational device includes third and fourth transistors coupled to said second differential output terminal via respective conduction terminals.

15. An electronic apparatus comprising an electronic amplifier configured to operate as a driver for at least one of a piezoelectric actuator and an embedded piezoelectric speaker, each having first and second terminals, the electronic amplifier comprising:

first and second differential input terminals configured to receive an input signal;

first and second differential output terminals configured to be respectively coupled to the first and second terminals of the at least one of a piezoelectric actuator and an embedded piezoelectric speaker and to provide a differential output signal to the first and second terminals of the at least one of a piezoelectric actuator and an embedded piezoelectric speaker;

a first operational device having first and second differential inputs coupled to said first and second differential input terminals, respectively, and an output coupled to said first differential output terminal; and a second operational device having first and second differential inputs coupled to said first and second differential input terminals, respectively, and an output coupled to said second differential output terminal;

said first and second operational devices being configured to set said first and second differential output terminals and the first and second terminals of the at least one of a piezoelectric actuator and an embedded piezoelectric speaker at a reference voltage to discharge the first and second terminals of the at least one of a piezoelectric actuator and an embedded piezoelectric speaker during periods where an amplitude of the differential output signal decreases.

16. The electronic apparatus according to claim 15 wherein said first and second operational devices each comprises an operational amplifier.

17. The electronic apparatus according to claim 15 further comprising first and second resistors configured to couple, respectively, said first and second differential inputs of said first operational device to said first and second differential input terminals.

18. The electronic apparatus according to claim 17 further comprising third and fourth resistors configured to couple, respectively, said first and second differential inputs of said second operational device to said first and second differential input terminals.

19. The electronic apparatus according to claim 15 further comprising at least one of a mobile phone, a personal digital assistant, a clock, an alarm clock, a laptop, medical ultrasound equipment, and an ultrasound air humidifier.

20. A method of making an electronic amplifier for driving a capacitive load having first and second terminals, the method comprising:

coupling first and second differential input terminals to receive an input signal;

coupling first and second differential output terminals respectively to the first and second terminals of the capacitive load to provide a differential output signal to the first and second terminals of the capacitive load;

coupling a first operational device having first and second differential inputs coupled to the first and second differential input terminals, respectively, and an output coupled to the first differential output terminal; and coupling a second operational device having first and second differential inputs coupled to the first and second differential input terminals, respectively, and an output coupled to the second differential output terminal;

using the first and second operational devices to set the first and second differential output terminals and the first and second terminals of the capacitive load at a reference voltage to discharge the first and second terminals of the capacitive load during periods where an amplitude of the differential output signal decreases.

21. The method according to claim 20 wherein the first and second operational devices each comprises an operational amplifier.

22. The method according to claim 20 further comprising coupling first and second resistors, respectively, to the first and second differential inputs of the first operational device to the first and second differential input terminals.

23. The method according to claim 22 further comprising coupling third and fourth resistors, respectively, to the first and second differential inputs of the second operational device to the first and second differential input terminals.

* * * * *